(12) United States Patent
Bai et al.

(10) Patent No.: US 11,587,836 B2
(45) Date of Patent: Feb. 21, 2023

(54) METHOD OF MANUFACTURING A SEMICONDUCTOR STRUCTURE BY FORMING A MASK LAYER USING SIDE WALL SPACERS AS AN ALIGNMENT MARK

(71) Applicants: Semiconductor Manufacturing International (Shanghai) Corporation, Shanghai (CN); Semiconductor Manufacturing International (Beijing) Corporation, Beijing (CN)

(72) Inventors: Song Bai, Shanghai (CN); Qi Liang Ma, Shanghai (CN); Tao Song, Shanghai (CN); Xuan Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 23 days.

(21) Appl. No.: 17/022,364

(22) Filed: Sep. 16, 2020

(65) Prior Publication Data
US 2021/0090960 A1  Mar. 25, 2021

(30) Foreign Application Priority Data
Sep. 20, 2019 (CN) .......................... CN201910892383

(51) Int. Cl.
*H01L 21/8238* (2006.01)
*H01L 29/66* (2006.01)
(Continued)

(52) U.S. Cl.
CPC .. *H01L 21/823821* (2013.01); *H01L 21/3086* (2013.01); *H01L 21/823468* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

2017/0125300 A1* 5/2017 Kim ................ H01L 21/823437
2020/0234966 A1* 7/2020 Chang ............. H01L 21/823431

* cited by examiner

Primary Examiner — Younes Boulghassoul
(74) Attorney, Agent, or Firm — Anova Law Group, PLLC

(57) ABSTRACT

A semiconductor structure and its fabrication method are provided in the present disclosure. The method includes providing a layer to-be-etched, including first regions and second regions. The method further includes forming a plurality of discrete first sacrificial layers on the layer to-be-etched, where a plurality of openings is between the plurality of first sacrificial layers and includes first openings on the first regions. The method further includes forming initial sidewall spacer structures on sidewalls of the plurality of first sacrificial layers, where the initial sidewall spacer structures include first sidewall spacers, and the first sidewall spacers fill the first openings. The method further includes, using the first sidewall spacers as an alignment mark, forming a first mask layer on the layer to-be-etched and the initial sidewall spacer structures, where the first mask layer exposes a portion of the layer to-be-etched and a portion of the initial sidewall spacer structures.

19 Claims, 4 Drawing Sheets

(51) Int. Cl.
*H01L 21/8234* (2006.01)
*H01L 21/308* (2006.01)
*H01L 29/78* (2006.01)

(52) U.S. Cl.
CPC .. *H01L 29/66795* (2013.01); *H01L 29/66803* (2013.01); *H01L 29/785* (2013.01)

(58) Field of Classification Search
CPC .......... H01L 27/1211; H01L 27/10826; H01L 27/10879; H01L 29/41791; H01L 29/66795–66818; H01L 29/785–7856; H01L 2029/7857–7858; H01L 2924/13067; H01L 21/308–3088; H01L 21/033–0338; H01L 21/31144; H01L 21/32139; H01L 23/544; H01L 2223/54426; H01L 21/682; G03F 7/70633; G03F 7/70683; G03F 9/708–7084

See application file for complete search history.

METHOD OF MANUFACTURING A SEMICONDUCTOR STRUCTURE BY FORMING A MASK LAYER USING SIDE WALL SPACERS AS AN ALIGNMENT MARK

CROSS-REFERENCE TO RELATED APPLICATION

This application claims the priority of Chinese Patent Application No. 201910892383.0, filed on Sep. 20, 2019, the content of which is incorporated herein by reference in its entirety.

TECHNICAL FIELD

The present disclosure generally relates to the field of semiconductor manufacturing and, more particularly, relates to a semiconductor structure and its fabrication method.

BACKGROUND

With the continuous development of semiconductor process technology, process nodes have gradually reduced, and the conventional structures of metal-oxide-semiconductor (MOS) field effect transistors cannot meet the performance requirements of semiconductor devices. A fin field effect transistor (FinFET), as a multi-gate device, has attracted extensive attention. As the process nodes are further reduced, the process for forming the FinFET also encounters a variety of challenges. Therefore, there is a need to improve the performance of the existing FinFET.

SUMMARY

One aspect of the present disclosure provides a method for fabricating a semiconductor structure. The method includes providing a layer to-be-etched, including first regions and second regions. The method further includes forming a plurality of discrete first sacrificial layers on the layer to-be-etched, where a plurality of openings is between the plurality of first sacrificial layers and includes first openings on the first regions. The method further includes forming initial sidewall spacer structures on sidewalls of the plurality of first sacrificial layers, where the initial sidewall spacer structures include first sidewall spacers, and the first sidewall spacers fill the first openings. The method further includes, using the first sidewall spacers as an alignment mark, forming a first mask layer on the layer to-be-etched and the initial sidewall spacer structures, where the first mask layer exposes a portion of the layer to-be-etched and a portion of the initial sidewall spacer structures.

Optionally, each of the first openings has a first size which is in parallel with a surface direction of the layer to-be-etched and along an arranging direction of the first openings on a surface of the layer to-be-etched; and a range of the first size is from about 10 nm to about 60 nm.

Optionally, after forming the initial sidewall spacer structures and before forming the first mask layer, the method further includes removing the plurality of first sacrificial layers.

Optionally, the method further includes forming a filling layer on the layer to-be-etched and sidewalls of the initial sidewall spacer structures, where the filling layer exposes top surfaces of the initial sidewall spacer structures; and the first mask layer is on the filling layer.

Optionally, a material of the filling layer is different from each of a material of the initial sidewall spacer structures and a material of a surface of the layer to-be-etched.

Optionally, the material of the filling layer includes an inorganic material, and the inorganic material includes amorphous carbon.

Optionally, after forming the first mask layer, the method further includes, using the first mask layer as an etch mask, removing the portion of the initial sidewall spacer structures to form sidewall spacer structures.

Optionally, after removing the portion of the initial sidewall spacer structures, the method further includes, using the sidewall spacer structures as an etch mask, continuously etching the layer to-be-etched to form a fin.

Optionally, the first mask layer is made of a photoresist and formed through an exposure and development process.

Optionally, forming the initial sidewall spacer structures includes forming a sidewall spacer material layer on the layer to-be-etched and the sidewalls of the plurality of first sacrificial layers and etching back the sidewall spacer material layer till a surface of the layer to-be-etched is exposed to form the initial sidewall spacer structures.

Optionally, a material of the initial sidewall spacer structures is different from each of a material of the plurality of first sacrificial layers and a material of the surface of the layer to-be-etched.

Optionally, the material of the initial sidewall spacer structures includes an inorganic material, and the inorganic material includes silicon nitride.

Optionally, the plurality of first sacrificial layers is formed by a self-aligned multiple patterning process.

Optionally, forming the plurality of first sacrificial layers includes forming a first sacrificial material layer on the layer to-be-etched; forming a second stop material layer on the first sacrificial material layer; forming a second sacrificial material layer on the second stop material layer; and forming a patterned second mask layer on the second sacrificial material layer; using the second mask layer as a mask, etching the second sacrificial material layer to form second sacrificial layers on the second stop material layer; and forming third sidewall spacers on sidewalls of the second sacrificial layers; after forming the third sidewall spacers, removing the second sacrificial layers; and using the third sidewall spacers as an etch mask, etching the second stop material layer and the first sacrificial material layer to form the plurality of first sacrificial layers on the layer to-be-etched.

Optionally, the plurality of openings further includes second openings on the second regions; each of the second openings has a second size which is in parallel with a surface direction of the layer to-be-etched and along an arranging direction of the second openings on a surface of the layer to-be-etched; and the second size is greater than a first size.

Optionally, the initial sidewall spacer structures further include second sidewall spacers on sidewalls of second openings; each of the second sidewall spacers has a third size which is in parallel with the surface direction of the layer to-be-etched and along the arranging direction of the second openings on the surface of the layer to-be-etched; and the second size is greater than twice the third size.

Optionally, a material of the plurality of first sacrificial layers is different from a material of the sidewall spacer structures and includes poly-crystalline silicon.

Optionally, the layer to-be-etched includes a base substrate and a first stop material layer on the base substrate.

Optionally, the method further includes forming a third sacrificial material layer on the layer to-be-etched and forming a third stop material layer on the third sacrificial material layer.

Another aspect of the present disclosure includes a semiconductor structure fabricated by the above-mentioned method. The semiconductor structure includes a layer to-be-etched, including first regions and second regions; a plurality of discrete first sacrificial layers formed on the layer to-be-etched, where a plurality of openings is between the plurality of first sacrificial layers and includes first openings on the first regions; initial sidewall spacer structures formed on sidewalls of the plurality of first sacrificial layers, where the initial sidewall spacer structures include first sidewall spacers, and the first sidewall spacers fill the first openings; and a first mask layer, formed by using the first sidewall spacers as an alignment mark, on the layer to-be-etched and the initial sidewall spacer structures, where the first mask layer exposes a portion of the layer to-be-etched and a portion of the initial sidewall spacer structures.

Other aspects of the present disclosure can be understood by those skilled in the art in light of the description, the claims, and the drawings of the present disclosure.

Compared with the existing technology, the technical solutions provided by the present disclosure may achieve at least the following beneficial effects.

In the fabrication method of the semiconductor structure at the technical solution provided by the present disclosure, the first sidewall spacers completely fill the first openings, such that the area of the formed sidewall spacer structures may occupy a relatively large proportion of the area of first regions. When the first sidewall spacers are used as the alignment mark to form the patterned first mask layer, the first sidewall spacers may be easily detected, which is beneficial for the pattern accuracy of the formed first mask layer. Therefore, when the first mask layer is used as a mask to perform the subsequent process, the size and morphology of the semiconductor structure may be accurately controlled to improve the process stability, which is beneficial for improving the performance of the semiconductor structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor structure and its fabrication method are provided in the present disclosure. The method includes providing a layer to-be-etched, including first regions and second regions. The method further includes forming a plurality of discrete first sacrificial layers on the layer to-be-etched, where a plurality of openings is between the plurality of first sacrificial layers and includes first openings on the first regions. The method further includes forming initial sidewall spacer structures on sidewalls of the plurality of first sacrificial layers, where the initial sidewall spacer structures include first sidewall spacers, and the first sidewall spacers fill the first openings. The method further includes, using the first sidewall spacers as an alignment mark, forming a first mask layer on the layer to-be-etched and the initial sidewall spacer structures, where the first mask layer exposes a portion of the layer to-be-etched and a portion of the initial sidewall spacer structures.

FIGS. 1-4 illustrate cross-sectional structural schematics corresponding to certain stages for forming an exemplary semiconductor structure.

Figure 1:
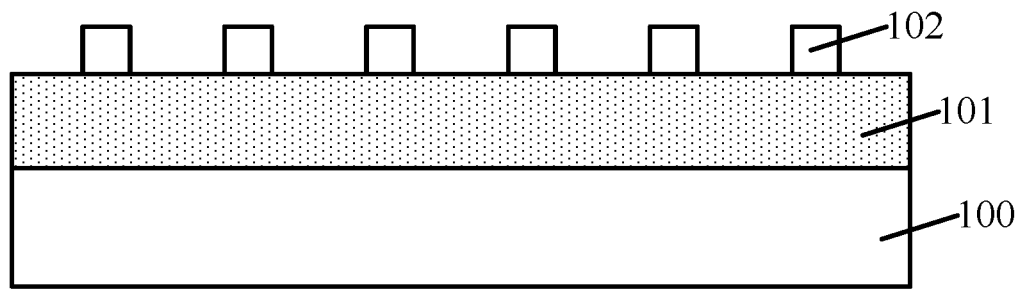
FIGS. 1-4 illustrate cross-sectional structural schematics corresponding to certain stages for forming an exemplary semiconductor structure.

Referring to FIG. 1, a base substrate 100 may be provided. A sacrificial material layer 101 may be on the base substrate 100. A patterned first mask layer 102 may be on the sacrificial material layer 101. The first mask layer 102 may expose a portion of the surface of the sacrificial material layer 101.

Figure 2:
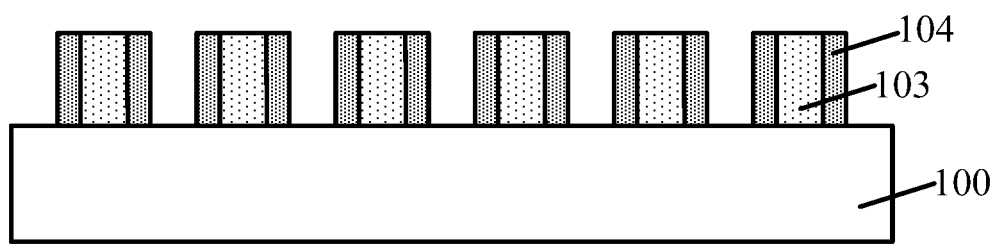

Referring to FIG. 2, using the first mask layer 102 as a mask, the sacrificial material layer 101 may be etched to form sacrificial layers 103 on the base substrate 100. Sidewall spacers 104 may be formed on sidewalls of the sacrificial layers 103.

Figure 3:
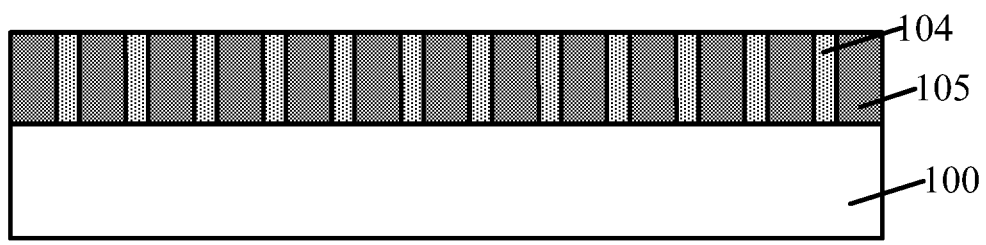

Referring to FIG. 3, the sacrificial layers 103 may be removed, and a filling layer 105 may be formed on the base substrate 100. The filling layer 105 may cover sidewalls of the sidewall spacers 104 and expose top surfaces of the sidewall spacers 104.

Figure 4:
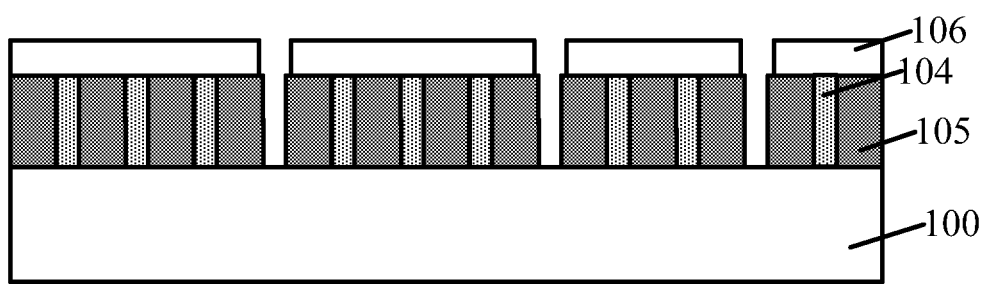

Referring to FIG. 4, a second mask layer 106 may be formed on the filling layer 105 and expose a portion of the top surfaces of the sidewall spacers 104. Exposed sidewall spacers 104 may be removed using the second mask layer 106 as a mask.

During the formation of the semiconductor structure, when the second mask layer 106 is formed on the filling layer 105, the material of the second mask layer 106 may include a photoresist, and the second mask layer 106 may be formed through exposure and development. Since the size of the sidewall spacer 104 is relatively small, an exposure position may be difficult to be positioned by a pattern when the pattern of the second mask layer is formed through exposure; therefore, the exposure position needs to be positioned by detecting feedback light signals of the sidewall spacers 104. However, since the overall area of the sidewall spacers 104 occupies a relatively small proportion of the surface area of the filling layer 105, the feedback light signals of the sidewall spacers 104 may be weak and difficult to be detected. Therefore, the position accuracy of the pattern may be relatively difficult to be controlled, and the sidewall spacers 104 may not be accurately removed when the second mask layer 106 is used as a mask to etch and remove the sidewall spacers 104. As a result, the morphology of a fin may be affected when the sidewall spacers 104 is used as a mask to continuously etch the base substrate 100 to form the fin, thereby affecting the performance of a subsequently formed semiconductor structure.

The technical solutions of the present disclosure provide a semiconductor structure and its formation method. By filling first openings with first sidewall spacers, the area of the formed sidewall spacer structures may occupy a relatively large proportion of the area of first regions. When the first sidewall spacers are used as the alignment mark to form the patterned first mask layer, the first sidewall spacers may be easily detected, which is beneficial for the pattern accuracy of the formed first mask layer. Therefore, when the first mask layer is used as a mask to perform the subsequent process, the size and morphology of the semiconductor structure may be accurately controlled to improve the process stability, which is beneficial for improving the performance of the semiconductor structure.

In order to further illustrate the above-mentioned described objectives, features, and advantages of the present disclosure, various specific embodiments of the present disclosure are described in detail with reference to the accompanying drawings hereinafter.

FIGS. 5-12 illustrate cross-sectional structural schematics corresponding to certain stages for forming an exemplary semiconductor structure according to various disclosed embodiments of the present disclosure.

Figure 5:
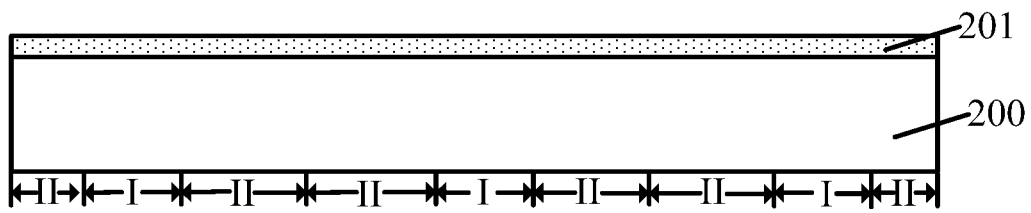
FIGS. 5-12 illustrate cross-sectional structural schematics corresponding to certain stages for forming an exemplary semiconductor structure according to various disclosed embodiments of the present disclosure.
Figure 13:
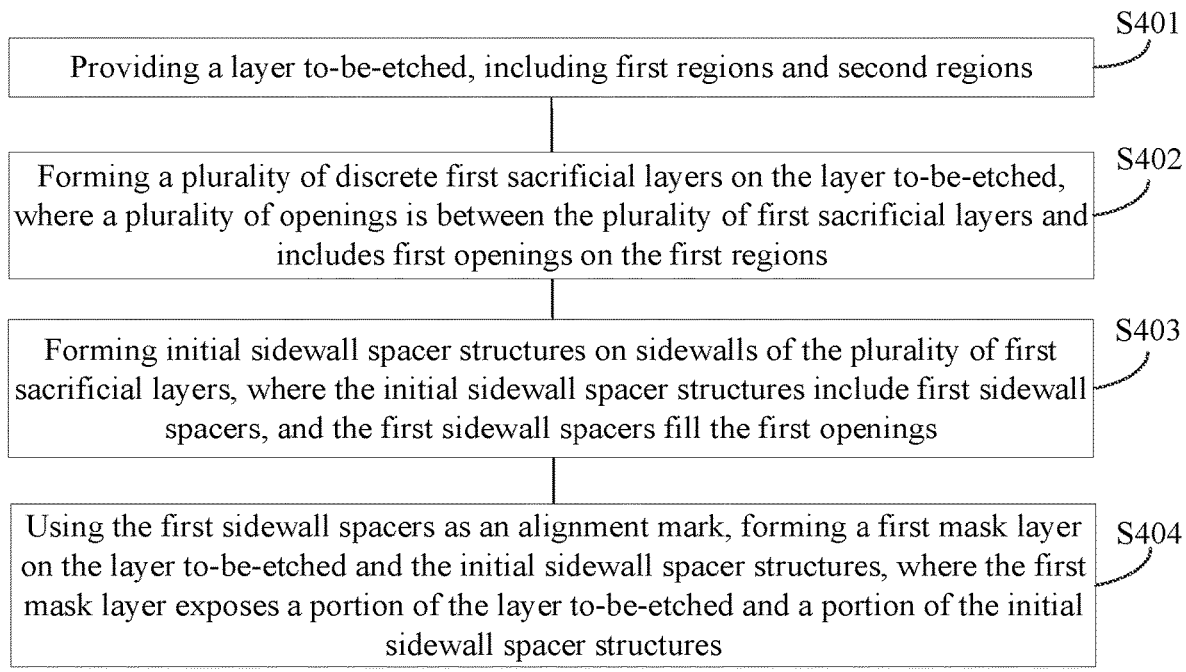
FIG. 13 illustrates a flowchart of an exemplary fabrication method for forming a semiconductor structure according to various disclosed embodiments of the present disclosure.

Referring to FIG. 5, a layer to-be-etched may be provided; the layer to-be-etched may include a base substrate 200 and a first stop material layer 201 on the base substrate 200; and the base substrate 200 may include first regions I and second regions II (e.g., in S401 of FIG. 13).

The first regions I of the base substrate 200 may be used to form the semiconductor devices having no specific functions, and the second regions II of the base substrate 200 may be used to form functional semiconductor devices.

The material of the base substrate 200 may include a semiconductor material. The semiconductor material may include silicon, silicon carbide, silicon germanium, a multi-element semiconductor material composed of group II-V elements, a silicon on insulator (SOI) material, a germanium on insulator (GOI) material, or any other suitable material(s). The multi-element semiconductor material composed of group II-V elements may include InP, GaAs, GaP, InAs, InSb, InGaAs or InGaAsP.

In one embodiment, the base substrate 200 may be made of a material including silicon.

The first stop material layer 201 may be used as an etch stop layer for subsequently etching a first sacrificial material layer to form first sacrificial layers. The first stop material layer 201 may be made of a material including silicon oxide or silicon nitride. The first stop material layer 201 may be formed by a chemical vapor deposition process or an atomic layer deposition process.

In one embodiment, the first stop material layer 201 may be made of a material including silicon oxide. The first stop material layer 201 may be formed by an atomic layer deposition process, which may form the first stop material layer 201 with a dense structure and a thin thickness.

In other embodiments, the method may further include forming a third sacrificial material layer on the layer to-be-etched and forming a third stop material layer on the third sacrificial material layer.

Next, a plurality of discrete first sacrificial layers may be formed on the layer to-be-etched; a plurality of openings may be between the plurality of first sacrificial layers; and the plurality of openings may include first openings on the first regions I.

In other embodiments, the plurality of discrete first sacrificial layers may be formed on the third stop material layer.

Figure 6:
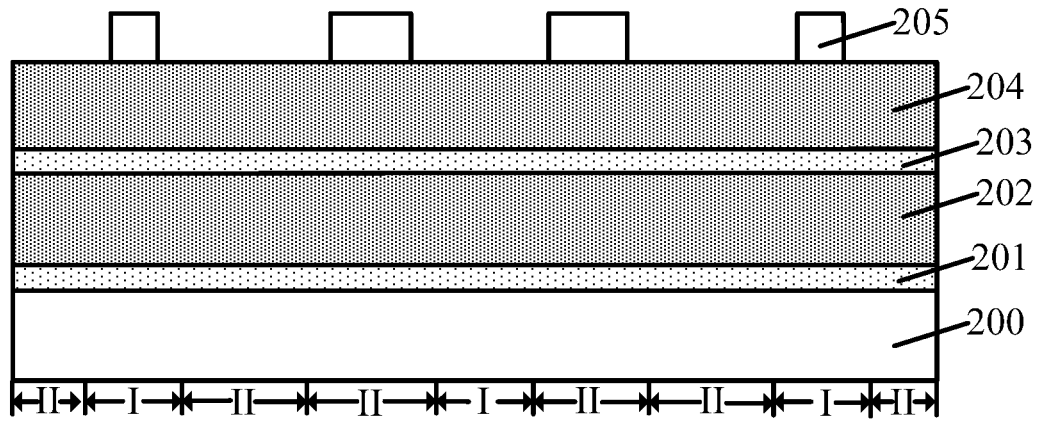
Figure 7:
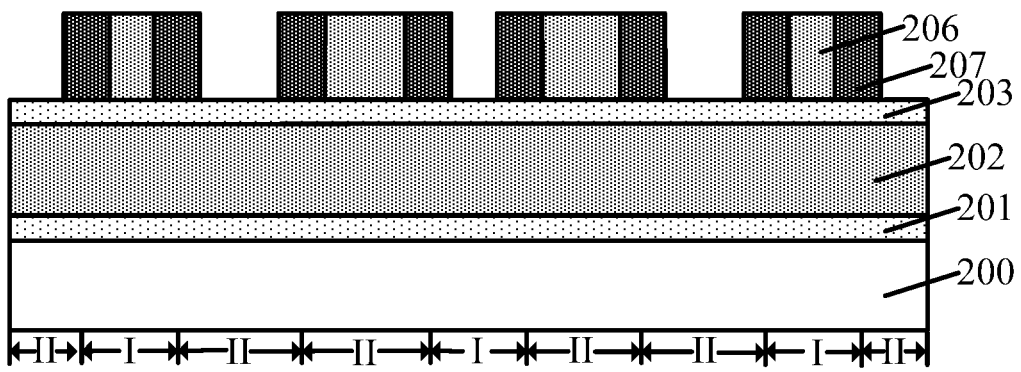
Figure 8:
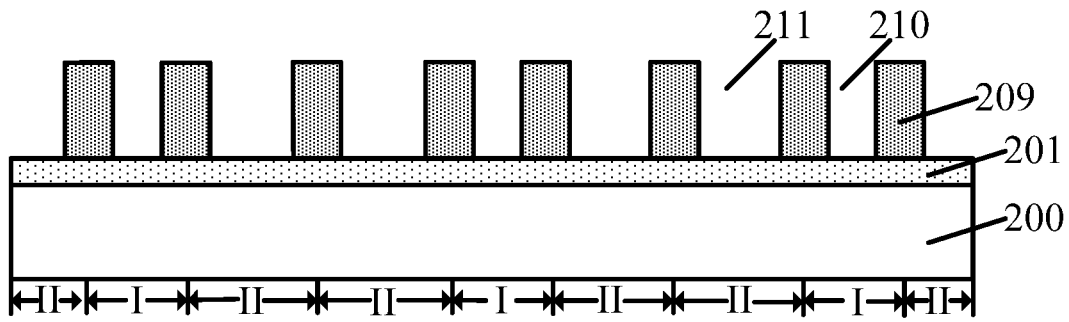

The first sacrificial layer may be formed by a self-aligned multiple patterning process, where the formation process may refer to FIGS. 6-8.

Referring to FIG. 6, a first sacrificial material layer 202 may be formed on the layer to-be-etched; a second stop material layer 203 may be formed on the first sacrificial material layer 202; a second sacrificial material layer 204 may be formed on the second stop material layer 203; a patterned second mask layer 205 may be formed on the second sacrificial material layer 204; and the second mask layer 205 may expose a portion of the surface of the second sacrificial material layer 204.

The second stop material layer 203 may be used as an etch stop layer for subsequently etching the second sacrificial material layer 204 to form second sacrificial layers. The second stop material layer 203 may be made of a material including silicon oxide or silicon nitride. The second stop material layer 203 may be formed by a chemical vapor deposition process or an atomic layer deposition process.

In one embodiment, the material of the second stop material layer 203 may be same as the material of the first stop material layer 201. The second stop material layer 203 may be made of a material including silicon oxide. The second stop material layer 203 may be formed by an atomic layer deposition process, which may form the second stop material layer 203 with a dense structure and a thin thickness.

The material of the first sacrificial material layer 202 may be different from the material of the first stop material layer 201. The first sacrificial material layer 202 may be made of a material including silicon oxide, silicon nitride, or poly-crystalline silicon. The first sacrificial material layer 202 may be formed by a chemical vapor deposition process, a physical vapor deposition process, or an atomic layer deposition process. The material of the second sacrificial material layer 204 may be different from the material of the second stop material layer 203. The second sacrificial material layer 204 may be made of a material including silicon oxide, silicon nitride, or poly-crystalline silicon. The second sacrificial material layer 204 may be formed by a chemical vapor deposition process, a physical vapor deposition process, or an atomic layer deposition process.

In one embodiment, the material of the first sacrificial material layer 202 may be same as the material of the second sacrificial material layer 204. The first sacrificial material layer 202 and the second sacrificial material layer 204 may be made of a material including poly-crystalline silicon. The first sacrificial material layer 202 and the second sacrificial material layer 204 may be formed by a physical vapor deposition process.

The material of the second mask layer 205 may include a photoresist or hard mask material. The hard mask material may include silicon oxide or silicon nitride. In one embodiment, the second mask layer 205 may be made of a material including a photoresist and may be formed by a spin coating process.

Referring FIG. 7, using the second mask layer 205 as a mask, the second sacrificial material layer 204 may be etched to form second sacrificial layers 206. Third sidewall spacers 207 may be formed on sidewalls of the second sacrificial layers 206.

The second sacrificial material layer 204 may be etched by a dry etching process or a wet etching process. In one embodiment, the second sacrificial material layer 204 may be etched by a dry etching process. The dry etching process may form the second sacrificial layers 206 with desirable morphology, which is beneficial for the accuracy of subsequent pattern transfer.

The formation of the third sidewall spacers 207 may include forming a sidewall spacer material layer (not shown) on the second stop material layer 203, the sidewall surfaces of the second sacrificial layers 206, and the top surfaces of the second sacrificial layers 206, and include etching back the sidewall spacer material layer till the surface of the second stop material layer 203 is exposed to form the third sidewall spacers 207.

The material of the third sidewall spacers 207 may be different from each of the material of the second stop material layer 203 and the material of the second sacrificial layers 206. In such way, when the sidewall spacer material layer is etched back, the etching process may have less damage on the second stop material layer 203 and the second sacrificial layers 206. The third sidewall spacer 207 may be made of a material including silicon oxide, silicon nitride, or poly-crystalline silicon. The sidewall spacer material layer may be formed by a chemical vapor deposition process or an atomic layer deposition process.

In one embodiment, the third sidewall spacers 207 may be made of a material including silicon nitride. The sidewall spacer material layer may be formed by a chemical vapor deposition process.

Referring to FIG. 8, after forming the third sidewall spacers 207, the second sacrificial layers 206 may be removed; using the third sidewall spacers 207 as a mask, the second stop material layer 203 and the first sacrificial material layer 202 may be etched to form a plurality of discrete first sacrificial layers 209 on the layer to-be-etched and a second stop layer (not shown) on the plurality of discrete first sacrificial layers 209 (e.g., in S402 of FIG. 13).

The plurality of discrete first sacrificial layers 209 may have a plurality of openings; and the plurality of openings may include first openings 210 on the first regions I and second openings 211 on the second regions II (e.g., in S402 of FIG. 13).

The first openings 210 may have a first size which is in parallel with the surface direction of the layer to-be-etched and along the arranging direction of the first openings 210 on the surface of the layer to-be-etched; the second openings 211 may have a second size which is in parallel with the surface direction of the layer to-be-etched and along the arranging direction of the second openings 211 on the surface of the layer to-be-etched, where the second size may be greater than the first size.

The second size is greater than the first size, which ensures that the sidewall spacer material may fill the first openings 210 to form combined first sidewall spacers when the initial sidewall spacer structures are formed subsequently. Therefore, when the patterned first mask layer is formed using the first sidewall spacers as the alignment mark, the first sidewall spacers may be easily detected and the position of the patterned first mask layer may be more accurate. As a result, when the first mask layer is used as the mask to perform the subsequent process, the size and morphology of the semiconductor structure may be accurately controlled, which is beneficial for improving the performance of the semiconductor structure. The sidewall spacer material may be located on the sidewalls of the second openings 211 to form discrete second sidewall spacers, which may meet the requirement of the semiconductor structure.

In one embodiment, the first size range may be about 10 nm to about 60 nm.

The first size range is about 10 nm to about 60 nm, such that when the sidewall spacer material is filled in the first openings 210, combined first sidewall spacers may be formed in the first openings 210. If the first size is less than 10 nm, the sidewall spacer material is relatively difficult to be filled the first openings 210. If the first size is greater than 60 nm, the relatively thick sidewall spacer material may need to be filled if combined first sidewall spacers are formed in the first openings 210, which is not beneficial for forming small-sized devices.

The second sacrificial layers 206 may be removed by a dry etching process or a wet etching process. The second stop material layer 203 and the first sacrificial layer 202 may be etched by a dry etching process or a wet etching process.

In one embodiment, the second sacrificial layers 206 may be etched by a dry etching process. The dry etching process may better remove the second sacrificial layer 206, which may avoid that the lateral etching causes damage to the morphology of the third sidewall spacers 207. The second stop material layer 203 and the first sacrificial layer 202 may be etched by a dry etching process. The dry etching process may form the first sacrificial layer 209 with desirable morphology, which is beneficial for the accuracy of pattern transfer and the performance improvement of the semiconductor structure.

Referring to FIG. 8, the second stop layer may be removed after forming the first sacrificial layer 209.

The method for removing the second stop layer may include forming a protection material layer (not shown) on the layer to-be-etched, the sidewall surface of the first sacrificial layer 209, and the sidewall surface and the top surface of the second stop layer, etching the protection material layer till the top surface and the sidewall surface of the second stop layer are completely exposed, thereby forming a protection layer (not shown) on the surface of the layer to-be-etched and the sidewall surface of the first sacrificial layer 209, removing the second stop layer, and removing the protection layer.

The protection layer may be used to protect the sidewall surface of the first sacrificial layer 209 and the surface of the layer to-be-etched and avoid that the process of removing the second stop layer damages the sidewall surface of the first sacrificial layer 209 and the surface of the layer to-be-etched, which may affect the performance of the semiconductor structure.

The protection material layer may be made of a material including amorphous carbon. The protection material layer may be formed by a spin coating process. The second stop layer may be removed by a wet etching process. The wet etching process may completely remove the second stop layer without damaging the protection layer. The second stop layer may be removed by a dry etching process. The dry etching process may be a simple process to remove the protection layer easily and completely.

Figure 9:
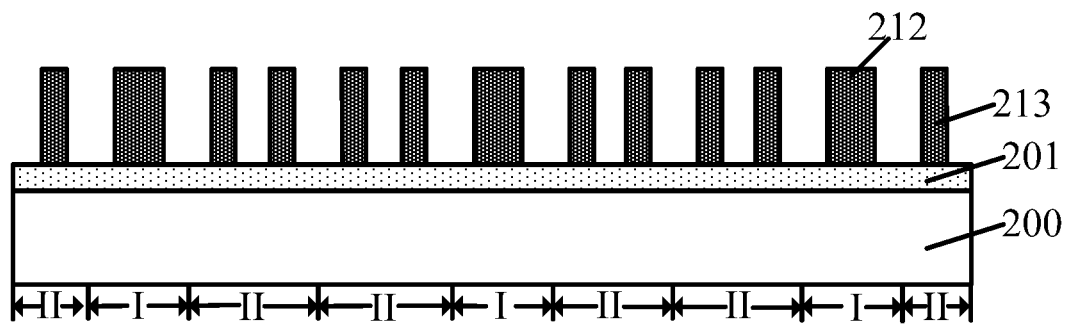

Referring to FIG. 9, initial sidewall spacer structures may be formed on the sidewalls of the first sacrificial layers 209; the initial sidewall spacer structures may include first sidewall spacers 212; and the first sidewall spacers 212 may completely fill the first openings 210 (e.g., in S403 of FIG. 13).

In some embodiments, the first sidewall spacers 212 completely fills the first openings 210, such that a relatively large proportion of the area of the first regions I of the layer to-be-etched may be occupied by the formed initial sidewall spacer structures. When the patterned first mask layer is formed using the first sidewall spacers 212 as the alignment mark, the first sidewall spacers 212 may be easily detected and the position of the patterned first mask layer formed may be more accurate. Therefore, when the first mask layer is used as a mask to perform the subsequent process, the size and morphology of the semiconductor structure may be accurately controlled to improve the process stability, which is beneficial for improving the performance of the semiconductor structure.

The initial sidewall spacer structures may further include second sidewall spacers 213 which are located on the sidewalls of the second openings 211. The second sidewall spacers 213 may have a third size which is in parallel with the surface direction of the layer to-be-etched and along the arranging direction of the second openings 211 on the surface of the layer to-be-etched, and the second size may be greater than twice the third size.

The second size is greater than twice the third size, such that the discrete second sidewall spacers 213 may be located at the sidewalls of the second openings to form the set mask pattern to continuously etching the layer to-be-etched.

The formation of the initial sidewall spacer structures may include forming a sidewall spacer material layer (not shown) on the layer to-be-etched and the sidewall surfaces and the top surfaces of the first sacrificial layers 209, and include etching back the sidewall spacer material layer till the surface of the first stop material layer 201 is exposed to form the initial sidewall spacer structures.

The material of the initial sidewall spacer structure may be different from each of the material of the first stop material layer 201 and the material of the first sacrificial layer 209. In such way, when the sidewall spacer material layer is etched back, the etching process may have less damage on the first stop material layer 201 and the first sacrificial layer 209. The initial sidewall spacer structure may be made of a material including silicon oxide, silicon nitride, or poly-crystalline silicon. The sidewall spacer material layer may be formed by a chemical vapor deposition process or an atomic layer deposition process.

In one embodiment, the initial sidewall spacer structure may be made of a material including silicon nitride. The sidewall spacer material layer may be formed by a chemical vapor deposition process.

In other embodiments, the first sidewall spacers may not fill the first openings and may be located on the sidewalls of the first openings, which may ensure that a relatively large proportion of the area of the layer to-be-etched may be occupied by the the overall area of the formed initial sidewall spacer structures. The initial sidewall spacer structures may be easily detected and the position of the patterned first mask layer formed may be more accurate. Therefore, when the first mask layer is used as a mask to remove a portion of the initial sidewall spacer structures, the size and morphology of the semiconductor structure may be accurately controlled to improve the process stability, which is beneficial for improving the performance of the semiconductor structure.

Referring FIG. 9, the first sacrificial layers 209 may be removed after forming the initial sidewall spacer structures.

The first sacrificial layers 209 may be removed by a dry etching process or a wet etching process.

In one embodiment, the first sacrificial layers 209 may be etched by a dry etching process. The dry etching process may better remove the first sacrificial layers 209, which may avoid that the lateral etching causes damage to the morphology of the initial sidewall spacer structures. When the formed sidewall spacer structure is continuously etched subsequently, the semiconductor structure with desirable morphology may be formed, which is beneficial for the performance improvement of the semiconductor structure.

In other embodiments, the first sacrificial layers may not be removed.

Figure 10:
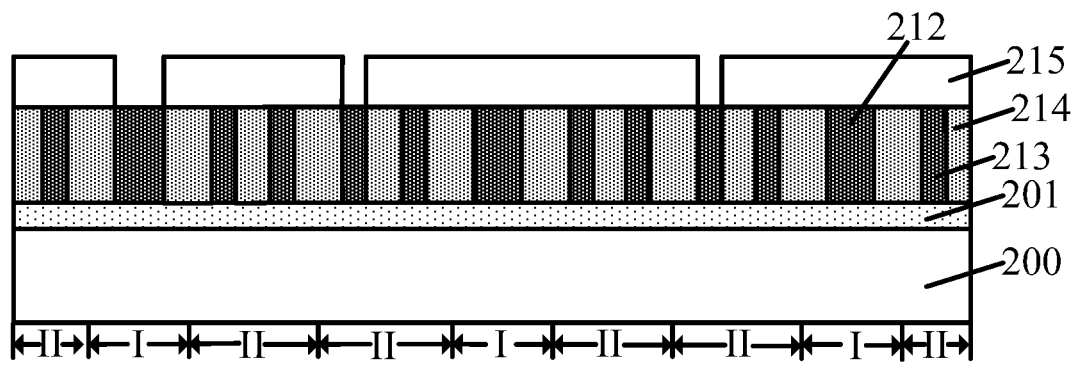

Referring to FIG. 10, a filling layer 214 may be formed on the layer to-be-etched and the sidewalls of the initial sidewall spacer structures and may expose the top surfaces of the initial sidewall spacer structures.

The filling layer 214 may provide structural support for the subsequent formation of the first mask layer on the initial sidewall spacer structures, such that the first mask layer may be used to accurately remove a portion of the initial sidewall spacer structures using the first sidewall spacers as the alignment mark. The layer to-be-etched may be subsequently etched using the formed sidewall spacer structures, such that the size and morphology of the semiconductor structure may be accurately controlled to improve the process stability, which is beneficial for improving the performance of the semiconductor structure.

The filling layer 214 may be made of a material including an inorganic material, and the inorganic material may include amorphous carbon. The formation process of the amorphous carbon may be simple, and the amorphous carbon may be easily and completely removed in the subsequent removal process, such that it may not affect the morphology of the semiconductor structure.

Referring to FIG. 10, using the first sidewall spacers 212 as the alignment mark, a first mask layer 215 may be formed on the filling layer 214 and the initial sidewall spacer structures; and the first mask layer 215 may expose a portion of the initial sidewall spacer structures (e.g., in S404 of FIG. 13).

In one embodiment, the first mask layer 215 may be made of a material including a photoresist and may be formed by an exposure and development process.

The first sidewall spacers 212 completely fills the first openings 210, such that a relatively large proportion of the area of the first regions of the layer to-be-etched may be occupied by the formed sidewall spacer structures. When the patterned first mask layer is formed using the first sidewall spacers as the alignment mark, the first sidewall spacers 212 may be easily detected because of the large volume of the first sidewall spacers 212, and the position of the patterned first mask layer 215 which is formed by exposure and development may be more accurate. Therefore, when the first mask layer 215 is used as a mask to perform the subsequent process, the size and morphology of the semiconductor structure may be accurately controlled to improve the process stability, which is beneficial for improving the performance of the semiconductor structure.

Figure 11:
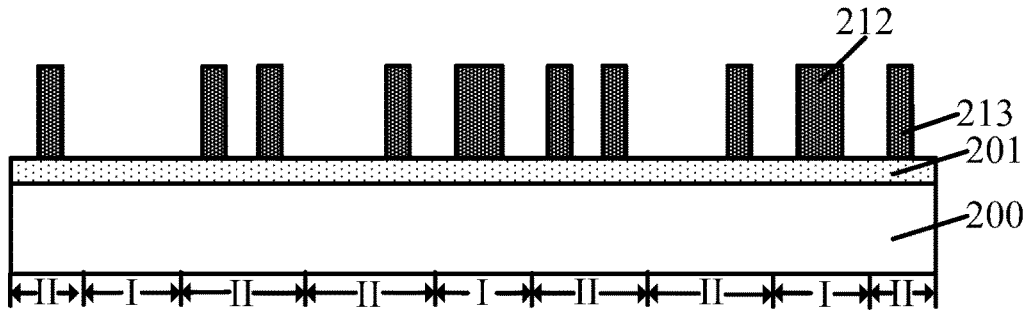

Referring to FIG. 11, using the first mask layer 215 as the mask, a portion of the first sidewall spacers 212 and the second sidewall spacers 213 may be removed to form the sidewall spacer structures.

A portion of the initial sidewall spacer structures may be removed to form the sidewall spacer structures. The sidewall spacer structures may be used as the mask to continuously etching the layer to-be-etched to form a desirable semiconductor structure.

A portion of the initial sidewall spacer structures may be removed by a dry etching process or a wet etching process.

In one embodiment, a portion of the initial sidewall spacer structures may be removed by a dry etching process. The dry etching process may completely remove the small-sized initial sidewall spacer structures, such that it may avoid that the initial sidewall spacer structures are not completely removed to affect the performance of the subsequently formed semiconductor structure, which is beneficial for the performance improvement of the semiconductor structure.

Referring to FIG. 11, after forming the sidewall spacer structures, the first mask layer 215 and the filling layer 214 may be removed.

In one embodiment, the first mask layer 215 may be removed by an ashing process, and the filling layer 214 may be removed by a dry etching process. The dry etching process for removing the filling layer 214 may be simple, and the filling layer 214 may be easily and completely removed, such that it may not affect the performance of the subsequently formed semiconductor structure.

In other embodiments, the filling layer may not be removed.

Figure 12:
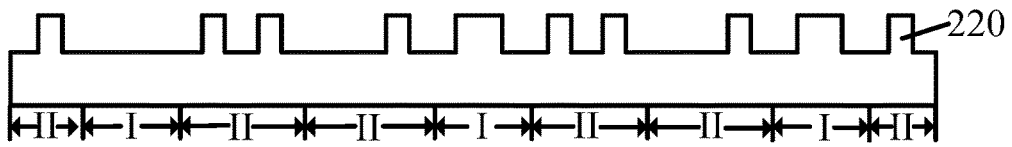

Referring to FIG. 12, using the sidewall spacer structures as the mask, the first stop material layer 201 and the base substrate 200 may be continuously etched to form a fin 220.

The first stop material layer 201 and the base substrate 200 may be continuously etched by a dry etching process or a wet etching process.

In one embodiment, the first stop material layer 201 and the base substrate 200 may be continuously etched by a dry etching process. The fin 220 with desirable morphology may be formed by the dry etching process. In other embodiments, the first stop material layer and the base substrate may be continuously etched to form a gate structure or other semiconductor structures which need to be formed using a self-aligned multiple patterning process.

The semiconductor structure may be formed and the performance of the semiconductors structure may be improved.

Correspondingly, the embodiments of the present disclosure further provide a semiconductor structure formed by the above-mentioned methods. Referring to FIG. 12, the semiconductor structure may include the base substrate and the fin 220 on the base substrate.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A fabrication method of a semiconductor structure, comprising:
providing a layer to-be-etched, including first regions and second regions;
forming a plurality of discrete first sacrificial layers on the layer to-be-etched, wherein a plurality of openings is between the plurality of first sacrificial layers and includes first openings on the first regions and second openings on the second regions, and each first opening is separated from an adjacent first opening by two corresponding second openings;
forming initial sidewall spacer structures on sidewalls of the plurality of first sacrificial layers, wherein the initial sidewall spacer structures include first sidewall spacers, and the first sidewall spacers fill the first openings; and
using the first sidewall spacers as an alignment mark, forming a first mask layer on the layer to-be-etched and the initial sidewall spacer structures, wherein the first mask layer exposes a portion of the layer to-be-etched and a portion of the initial sidewall spacer structures.

2. The method according to claim 1, wherein:
each of the first openings has a first size which is in parallel with a surface direction of the layer to-be-etched and along an arranging direction of the first openings on a surface of the layer to-be-etched; and
a range of the first size is from about 10 nm to about 60 nm.

3. The method according to claim 1, wherein after forming the initial sidewall spacer structures and before forming the first mask layer, the method further includes:
removing the plurality of first sacrificial layers.

4. The method according to claim 1, wherein after forming the first mask layer, the method further includes:
using the first mask layer as an etch mask, removing the portion of the initial sidewall spacer structures to form sidewall spacer structures.

5. The method according to claim 4, wherein after removing the portion of the initial sidewall spacer structures, the method further includes:
using the sidewall spacer structures as an etch mask, continuously etching the layer to-be-etched to form a fin.

6. The method according to claim 1, wherein:
the first mask layer is made of a photoresist and formed through an exposure and development process.

7. The method according to claim 1, wherein forming the initial sidewall spacer structures includes:
forming a sidewall spacer material layer on the layer to-be-etched and the sidewalls of the plurality of first sacrificial layers and etching back the sidewall spacer material layer till a surface of the layer to-be-etched is exposed to form the initial sidewall spacer structures.

8. The method according to claim 7, wherein:
a material of the initial sidewall spacer structures is different from each of a material of the plurality of first sacrificial layers and a material of the surface of the layer to-be-etched.

9. The method according to claim 8, wherein:
the material of the initial sidewall spacer structures includes an inorganic material, and the inorganic material includes silicon nitride.

10. The method according to claim 1, wherein:
the plurality of first sacrificial layers is formed by a self-aligned multiple patterning process.

11. The method according to claim 10, wherein forming the plurality of first sacrificial layers includes:
forming a first sacrificial material layer on the layer to-be-etched; forming a second stop material layer on the first sacrificial material layer; forming a second sacrificial material layer on the second stop material layer; and forming a patterned second mask layer on the second sacrificial material layer;
using the second mask layer as a mask, etching the second sacrificial material layer to form second sacrificial layers on the second stop material layer; and forming third sidewall spacers on sidewalls of the second sacrificial layers;
after forming the third sidewall spacers, removing the second sacrificial layers; and
using the third sidewall spacers as an etch mask, etching the second stop material layer and the first sacrificial material layer to form the plurality of first sacrificial layers on the layer to-be-etched.

12. The method according to claim 1, wherein:
each of the second openings has a second size which is in parallel with a surface direction of the layer to-be-etched and along an arranging direction of the second openings on a surface of the layer to-be-etched; and
the second size is greater than a first size.

13. The method according to claim 12, wherein:
the initial sidewall spacer structures further include second sidewall spacers on sidewalls of second openings;
each of the second sidewall spacers has a third size which is in parallel with the surface direction of the layer to-be-etched and along the arranging direction of the second openings on the surface of the layer to-be-etched; and
the second size is greater than twice the third size.

14. The method according to claim 1, wherein:
a material of the plurality of first sacrificial layers is different from a material of the initial sidewall spacer structures and includes poly-crystalline silicon.

15. The method according to claim 1, wherein:
the layer to-be-etched includes a base substrate and a first stop material layer on the base substrate.

16. The method according to claim 15, further including:
forming a third sacrificial material layer on the layer to-be-etched and forming a third stop material layer on the third sacrificial material layer.

17. A fabrication method of a semiconductor structure, comprising:
providing a layer to-be-etched, including first regions and second regions;
forming a plurality of discrete first sacrificial layers on the layer to-be-etched, wherein a plurality of openings is between the plurality of first sacrificial layers and includes first openings on the first regions;
forming initial sidewall spacer structures on sidewalls of the plurality of first sacrificial layers, wherein the initial sidewall spacer structures include first sidewall spacers, and the first sidewall spacers fill the first openings;
removing the plurality of first sacrificial layers;
forming a filling layer on the layer to-be-etched and sidewalls of the initial sidewall spacer structures; and
using the first sidewall spacers as an alignment mark, forming a first mask layer on the layer to-be-etched and the initial sidewall spacer structures, wherein the first mask layer exposes a portion of the layer to-be-etched and a portion of the initial sidewall spacer structures, wherein:
the filling layer exposes top surfaces of the initial sidewall spacer structures; and
the first mask layer is on the filling layer.

18. The method according to claim 17, wherein:
a material of the filling layer is different from each of a material of the initial sidewall spacer structures and a material of a surface of the layer to-be-etched.

19. The method according to claim 18, wherein:
the material of the filling layer includes an inorganic material, and the inorganic material includes amorphous carbon.

* * * * *